(12) United States Patent
Kotzian et al.

(10) Patent No.: US 8,969,768 B2
(45) Date of Patent: Mar. 3, 2015

(54) APPLICATOR AND APPARATUS FOR HEATING SAMPLES BY MICROWAVE RADIATION

(75) Inventors: Heimo Kotzian, Graz (AT); Johannes Zach, St. Marein (AT); Rainer Zentner, Graz (AT)

(73) Assignee: Anton Paar GmbH, Graz (AT)

( * ) Notice: Subject to any disclaimer, the term of this patent is extended or adjusted under 35 U.S.C. 154(b) by 869 days.

(21) Appl. No.: 12/361,888

(22) Filed: Jan. 29, 2009

(65) Prior Publication Data

US 2009/0194528 A1    Aug. 6, 2009

Related U.S. Application Data

(60) Provisional application No. 61/025,921, filed on Feb. 4, 2008.

(30) Foreign Application Priority Data

Feb. 1, 2008  (EP) .................................... 08150982

(51) Int. Cl.
*H05B 6/70* (2006.01)
*H05B 6/80* (2006.01)
(Continued)

(52) U.S. Cl.
CPC .............. *H05B 6/806* (2013.01); *B01J 19/126* (2013.01); *H01J 7/24* (2013.01); *H05B 6/70* (2013.01); *H05H 1/46* (2013.01); *C23C 16/00* (2013.01); *B01J 2219/00063* (2013.01);
(Continued)

(58) Field of Classification Search
CPC ............ H01J 2237/0044; H01J 37/026; H01J 37/3171; H01J 21/26513; H01J 37/32247; H01J 37/32192; H01J 37/32229; H05H 1/46; C23C 16/045; C23C 16/511; C03C 17/004; C03C 37/0183
USPC .................................................. 219/690, 697
See application file for complete search history.

(56) References Cited

U.S. PATENT DOCUMENTS

3,474,209 A * 10/1969 Parker ........................... 219/696
3,555,232 A    1/1971 Bleackley .................. 219/10.55
(Continued)

FOREIGN PATENT DOCUMENTS

EP    1 228 801    8/2002    .............. B01J 19/12
GB    2 206 470    1/1989    .............. H05B 6/00
(Continued)

OTHER PUBLICATIONS

European Search Report for EP 08 15 0982, Jun. 23, 2008.

*Primary Examiner* — Tu B Hoang
*Assistant Examiner* — Diallo I Duniver
(74) *Attorney, Agent, or Firm* — Kusner & Jaffe

(57) ABSTRACT

The present invention relates a microwave applicator for heating a sample by microwave radiation which is transmitted via an at least partially tapering transmission duct from a microwave source to a cavity adapted to receive the sample to be heated. The transmission duct has at least one external wall, said wall defining an internal space for the propagation of said microwave radiation and comprising an interface which is at least partially permeable to said microwave radiation. The interface is at least partially arranged within said tapering portion of the duct. The duct is adapted to form a jacket surrounding the cavity with said interface forming an inner wall of said jacket.

16 Claims, 4 Drawing Sheets

(51) Int. Cl.
    *B01J 19/12*     (2006.01)
    *H01J 7/24*     (2006.01)
    *H05H 1/46*     (2006.01)
    *C23C 16/00*     (2006.01)

(52) U.S. Cl.
    CPC ............... *B01J 2219/00094* (2013.01); *B01J 2219/00141* (2013.01); *B01J 2219/00162* (2013.01)
    USPC .......................................... 219/690; 219/697

(56) References Cited

U.S. PATENT DOCUMENTS

| | | | |
|---|---|---|---|
| 3,577,207 A * | 5/1971 | Kirjushin | 315/39 |
| 3,848,106 A | 11/1974 | Berggren et al. | 219/10.55 |
| 4,067,683 A | 1/1978 | Klaila | 431/11 |
| 4,740,763 A | 4/1988 | Wilhelm et al. | 333/22 |
| 4,883,570 A * | 11/1989 | Efthimion et al. | 204/164 |
| 5,030,929 A * | 7/1991 | Moeller | 333/21 R |
| 5,359,177 A | 10/1994 | Taki et al. | 219/121.43 |
| 5,364,519 A | 11/1994 | Fujimura et al. | 204/298.38 |
| 6,198,224 B1 * | 3/2001 | Spitzl et al. | 315/111.21 |
| 6,294,772 B1 | 9/2001 | Green et al. | 219/679 |
| 6,579,501 B1 | 6/2003 | Knapp et al. | 422/208 |
| 6,740,858 B2 * | 5/2004 | Tracy et al. | 219/687 |
| 7,002,122 B2 * | 2/2006 | Eves et al. | 219/699 |
| 2001/0035407 A1 | 11/2001 | Drozd et al. | 219/693 |
| 2002/0036201 A1 * | 3/2002 | Dalton | 219/759 |
| 2003/0102306 A1 | 6/2003 | Risman | 219/690 |
| 2003/0104139 A1 * | 6/2003 | House et al. | 427/569 |
| 2007/0228294 A1 * | 10/2007 | Ito et al. | 250/492.21 |
| 2009/0026963 A1 * | 1/2009 | Susuki | 315/111.21 |

FOREIGN PATENT DOCUMENTS

| | | | |
|---|---|---|---|
| GB | 2 387 544 | 10/2003 | ............ A61N 5/04 |
| WO | WO 90/04910 | 5/1990 | ............ H05B 6/78 |
| WO | WO 03/048409 | 6/2003 | ............ C23C 16/00 |
| WO | WO 2005/043953 | 5/2005 | |

\* cited by examiner

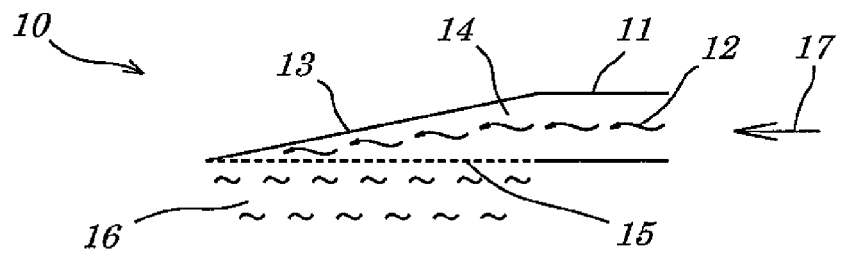
Fig. 1
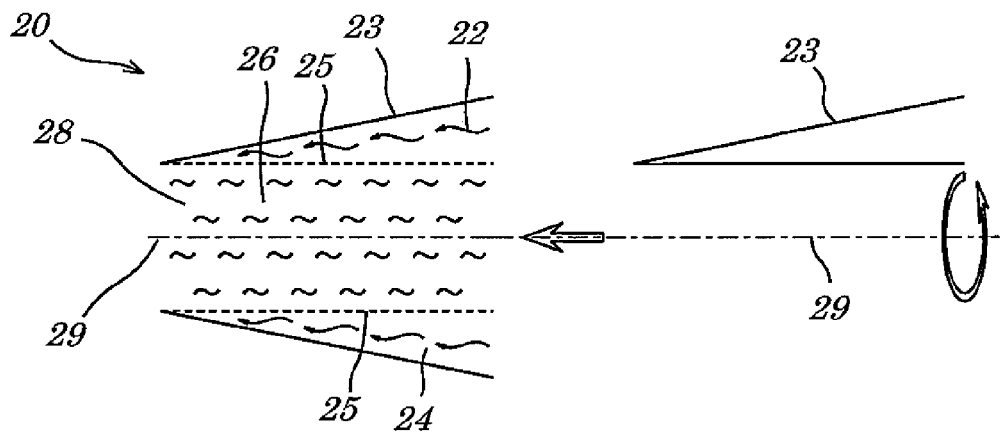
Fig. 2
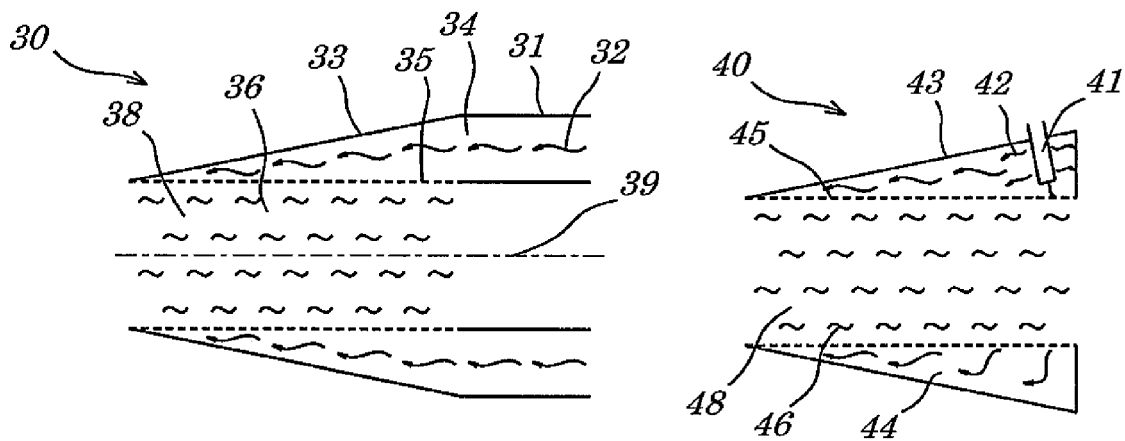 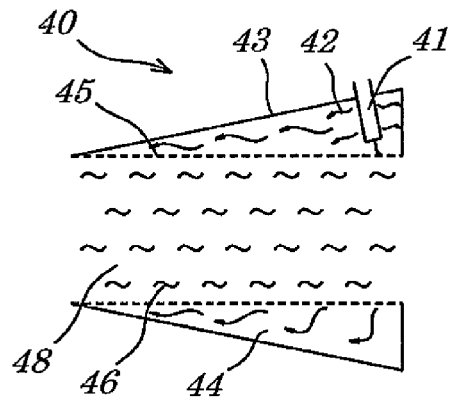
Fig. 3  Fig. 4

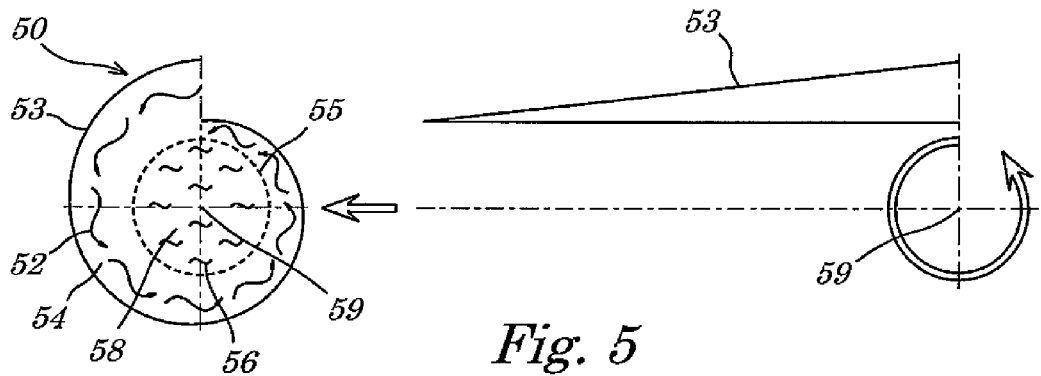
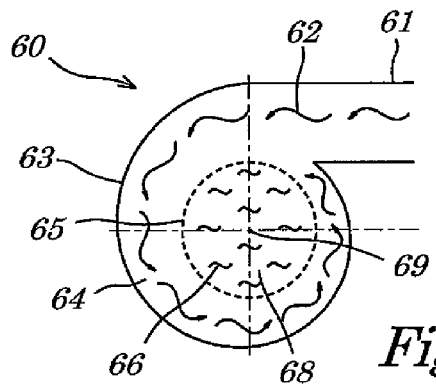
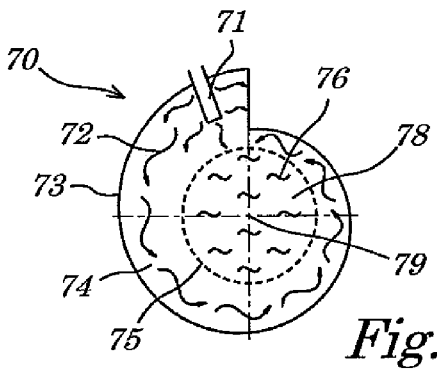
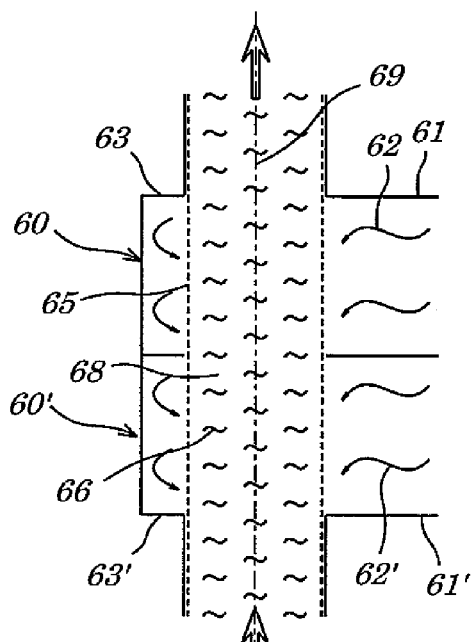
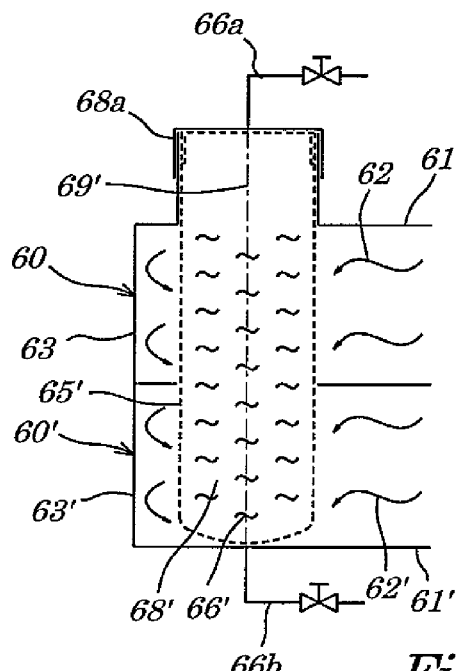
Fig. 5
Fig. 6
Fig. 7
Fig. 8
Fig. 9

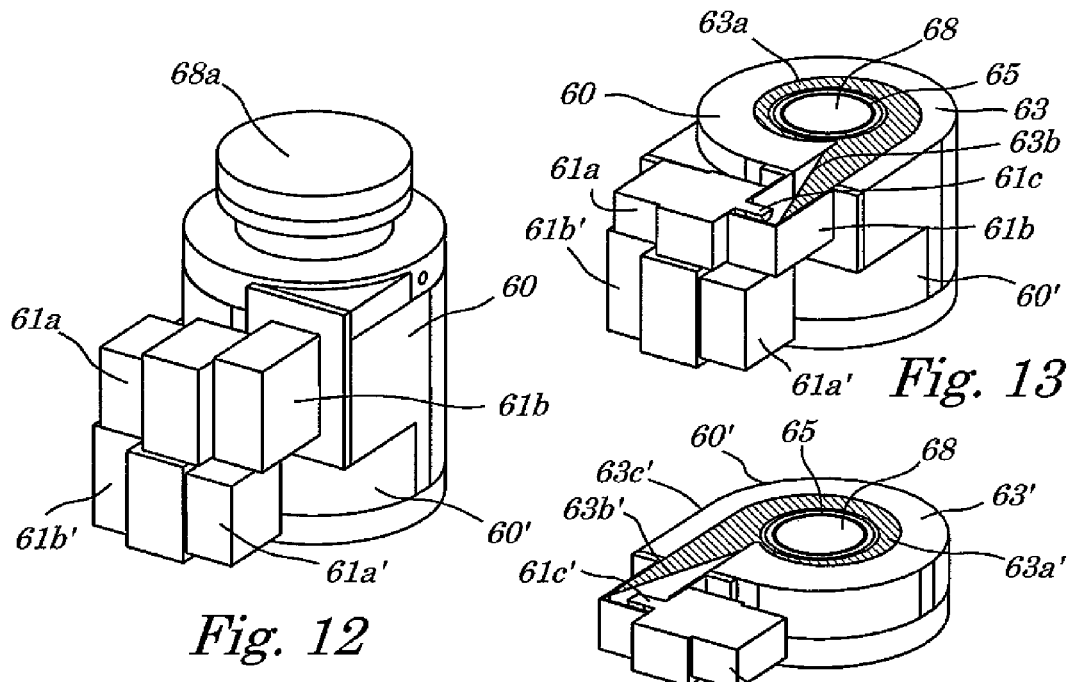
Fig. 12
Fig. 13
Fig. 14
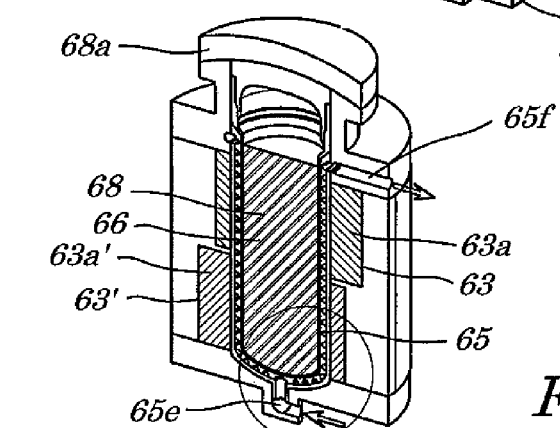
Fig. 15a
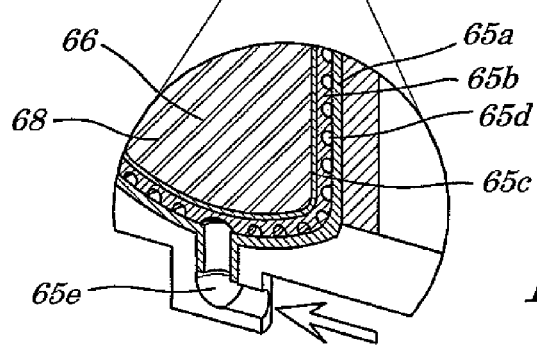
Fig. 15b

APPLICATOR AND APPARATUS FOR HEATING SAMPLES BY MICROWAVE RADIATION

RELATED APPLICATIONS

This application claims the benefit of U.S. Provisional Application No. 61/025,921, filed Feb. 4, 2008, which is fully incorporated herein by reference.

FIELD OF THE INVENTION

The present invention concerns a microwave applicator for heating a sample by microwave radiation and a microwave-heating apparatus which comprises at least one of these applicators.

BACKGROUND OF THE INVENTION

In microwave-assisted chemistry, microwaves are used to initiate, drive, or otherwise enhance chemical or physical reactions. Generally, the term "microwaves" refers to electromagnetic radiation having a frequency within a range of about $10^8$ Hz to $10^{12}$ Hz. These frequencies correspond to wavelengths between about 300 cm to 0.3 mm. Microwave-assisted chemistry is currently employed in a variety of chemical processes. Typical applications in the field of analytical chemistry include ashing, digestion and extraction methods. In the field of chemical synthesis, microwave radiation is typically employed for heating reaction materials, many chemical reactions proceeding advantageously at higher temperatures. In addition, when pressureriseable reaction vessels are used, many analytical or synthetical processes can be further enhanced by increasing the pressure in the vessel. Further, when, for example, digestion methods for analytical purposes are used, the generation or expansion of gases inside the vessel will necessarily increase the internal pressure. Thus, in order to ensure that no reaction products are lost for subsequent analysis, vessels must be used which are able to withstand high internal pressures in these cases.

Usually, most microwave-assisted reactions are performed in open or, preferably, in sealed vessels at temperatures rising up to 300° C. Typical pressures range from below atmospheric pressure, e.g. in solvent extraction processes, up to 100 bar, e.g. in digestion or synthesis processes.

Microwave-assisted chemistry is essentially based on the dielectric heating of substances capable of absorbing microwave radiation, which is subsequently converted into heat.

Many apparatuses and methods currently employed in microwave-assisted chemistry are based upon conventional domestic microwave ovens operating at a frequency of 2.45 GHz. As magnetrons operating at this frequency are produced in large quantities for domestic appliances, microwave apparatuses for microwave-assisted chemistry using such magnetrons can be manufactured at relatively low cost.

The microwaves generated by the magnetron are coupled via an antenna into a waveguide and transferred into a resonance cavity of the microwave oven. In order to avoid that microwave energy is reflected back into the waveguide, which might then damage the magnetron, care has to be taken to match the impedance of the waveguide and the impedance of the oven where the sample is arranged and to ensure that a sufficient amount of microwave energy is absorbed in the resonance cavity. Using appliances having a form factor of conventional domestic microwave appliances requires both that samples having a high absorbance for microwave radiation are employed and that relatively large amounts of these samples are present in the oven.

However, when larger amounts of samples are heated with microwave radiation, the problem arises that the depth of penetration of microwaves into the sample is relatively small. Consequently, direct microwave heating will only occur in sample areas which are close to the surface of the sample and the bulk of the sample will only be heated via thermal conductivity or, if liquid or gaseous samples are heated, by thermal convection. Specifically, insufficient heat transfer will often lead to inhomogeneous heating of the sample. Stirring of the sample only partly mitigates this problem because the larger the sample volume, the more difficult it is to reliably control the stirring and heating process.

In many applications, such as analytical chemistry and chemical synthesis, uniform heating of the samples is of utmost importance since, for example, reaction rates strongly depend on the temperature of the sample.

As already noted above, apparatuses using resonance cavities require a delicate impedance matching between the waveguide which transmits the microwave radiation from a microwave source to the resonance cavity and the resonance cavity itself. The resonance conditions within the cavity are, however, dependent on the samples to be heated, the type and filling level of solvents or reactants employed, etc. In addition, during the course of the chemical or physical process induced by microwave radiation, drastic variations of the dielectric properties of the samples, solvents or reactants may occur. In summary, in these prior art methods it is rather difficult to ensure that an effective, uniform and reproducible heating of samples, in particular larger amounts of samples, is achieved.

Various approaches which do not employ resonance cavities and which try to overcome the limitations associated with the use of rather conventional microwave ovens have been described in the prior art.

In GB 2 206 470, a cooker appliance is described in which radio frequency radiation having a frequency of typically 14 MHz is applied to food to be heated by means of a coaxial slow-wave transmission line arrangement. The use of comparatively low frequencies as compared to microwave radiation ensures a larger penetration depth of the radiation. While able to heat food, this appliance hardly produces enough radio frequency energy to heat larger samples to the temperatures required in microwave-assisted chemistry.

U.S. Pat. No. 6,294,772 describes a microwave probe applicator for physical and chemical processes which can be arranged within the reaction vessel, i.e. directly within the sample to be heated. This type of applicator produces a rather inhomogeneous microwave field within the sample.

In U.S. Pat. No. 3,848,106, an apparatus for heating by microwave energy is described which employs a dielectric material having a constant cross-sectional dimension in the direction of propagation of the microwave energy, which is arranged close to the sample to be heated and which enables to heat samples arranged close to the surface of the dielectric material. Due to the decreasing field strength in the direction of propagation of microwave radiation, the heating of the sample will not be homogeneous either.

WO 2005/043953 describes a continuous feed microwave applicator for heating food which is fed via a conveyor belt into a tapering application. This device is not suitable for heating liquid samples.

U.S. Pat. No. 4,067,683 describes a method and apparatus for controlling the fluency of hydrocarbon fluids by directing electromagnetic radiation through a dielectric cone into the fluid. While the apparatus of U.S. Pat. No. 4,067,683 might be sufficient to control the fluency of hydrocarbon fluids, no homogenous heating of the sample is possible.

WO 90/0910 describes a fluid pumping apparatus comprising a pipe section having a microwave transparent window allowing microwave energy to be directed into the pipe section to elevate the temperature of the fluid within the pipe section. This device does not allow homogenous heating of the fluid within the pipe either.

U.S. Pat. No. 3,555,232 describes a rectangular waveguide for heating samples within a central area of the waveguide. Longitudinally tapering ridges are provided within this waveguide in order to vary the ration of intensification to rarefaction of the electromagnetic filed. The provision of ridges renders the internal structure of the waveguide rather complex.

U.S. Pat. No. 3,474,209 discloses a method and apparatus for heat treatment of an article in a hollow waveguide having a non-linear taper in one dimension thereof. With and height of the waveguide have to be adapted to allow propagation of $TE_{01}$ waves only. Consequently only relatively flat articles positioned in the centre of the wave guide can be heated uniformly.

SUMMARY OF THE INVENTION

It is therefore an object of the present invention to provide an applicator and an apparatus which overcomes the drawbacks associated with prior art devices.

It is also an object of the present invention to provide an applicator and an apparatus for more homogeneously heating larger sample quantities by microwave radiation.

It is also an object of the present invention to provide an applicator and an apparatus which allow both pressurized and non-pressurized microwave heating.

According to the invention, a microwave applicator for heating a sample by microwave radiation is employed which comprises a source of microwave radiation, a transmission duct for transmitting the microwave radiation from the source to the sample, wherein the transmission duct has at least one external wall defining an internal space for the propagation of the microwave radiation. Typically, the external wall will be made from a conductive material, for instance a metallic material, which is impermeable to microwave radiation. The at least one wall comprises an interface which is at least partially permeable to the microwave radiation. The sample to be heated will be arranged close to the interface and microwave radiation propagating within the transmission duct will partly leave the transmission duct via the interface and enter the sample so that the sample can ultimately be heated. According to the invention, the transmission duct comprises a tapering portion which has an internal cross-section perpendicular to the direction of propagation of the microwave radiation, wherein the internal cross-section tapers, i.e. diminishes, along the direction of propagation of the microwave radiation. The at least partially microwave-permeable interface is at least partially arranged within the tapering portion of the transmission duct.

Due to the fact that part of the microwave radiation propagating within the transmission duct will be absorbed by the sample arranged at or close to the interface, the amplitude of the microwaves would normally decrease along the direction of propagation. According to the invention, this decrease is compensated by employing a tapering transmission duct where the tapering portion enables the maintenance of an enhanced field strength along the interface despite the fact that part of the microwave energy is leaving the transmission duct via the interface in order to heat the sample. Essentially, the tapering microwave applicator of the present invention enables the maintenance of a high energy density of the microwave radiation along the microwave-permeable interface and thus achieving high absorption rates within the neighbouring sample volume.

According to the invention, the interface can be made from any material which is partly or fully permeable to microwave radiation. Thus, in a very simple embodiment, the microwave applicator of the present invention consists of a hollow metallic transmission duct where the interface is constituted by a simple opening cut out in the metallic wall of the transmission duct. In a further embodiment, the interface is constituted by a window made from a dielectric material arranged within the wall of the transmission duct.

If the interface is not a simple opening in the wall of the transmission duct, the interface can be made from any suitable dielectric material which is partially permeable to microwave radiation. As the interface may be in direct contact with the sample to be heated, the interface is preferably made from a chemically inert material, such as glass, specifically quartz glass, fluoropolymer, such as polytetrafluoroethylene (PTFE), or polyether ether ketone (PEEK), or a ceramic material. In addition, in many applications cheaper dielectric materials such as borosilicate glass, polyethylene or polyvinyl chloride may also be used. If desired, the microwave applicator of the present invention can easily be adapted to particular sample vessels or sample conduits. Thus large amounts of samples can be treated either batch-wise or continuously.

In a very simple embodiment of the present invention, the applicator comprises an essentially planar interface which can be arranged on the surface of the sample to be treated. While solid samples can be treated directly, fluid samples are usually housed in a suitable container or vessel, wherein the vessel is at least in the area contacting the interface of the microwave applicator made from a material permeable to microwave radiation.

The microwave applicator of the present invention comprises a cavity adapted to receive a sample to be heated. The cavity has a longitudinal axis which can be any axis running through the centre of the cavity. The cavity can have the form of any suitable opening, recess, or clearance in the microwave applicator adapted to the requirements of a sample to be treated. Particularly, the microwave radiation employed does not pose any constructional or dimensional constraints on the cavity. Specifically, the cavity does not have to meet resonance conditions with respect to the microwave radiation. Thus, variations in the dielectric properties of the sample do not result in any mismatching of the transfer of microwave energy from the applicator to the sample.

Preferably, the tapering portion of the microwave duct has an essentially constant width parallel to the interface and a height perpendicular to the interface, said decreasing along the direction of propagation of the microwave radiation. Thus, the inner volume of the tapering portion of the transmission duct exhibits an overall wedge-like geometry. Usually, the microwave applicator will have an elongated interface which extends in the direction of propagation of the microwave radiation so that the tip of the wedge-like tapering section will constitute the end of the propagation path.

As the tapering portion of the transmission duct is provided to ensure maintenance of an essentially constant energy density at the microwave-permeable interface, the tapering portion will preferably coincide with a portion of the transmission duct which comprises the elongated surface.

The microwave applicator can be a hollow duct filled with air or, if the applicator is closed at the interface by a suitable window made from a dielectric material, can either be evacuated or filled with any suitable gas or a mixture of gases, for example, inert gases. Preferably, the transmission duct may be filled with any suitable dielectric material in gaseous, liquid or solid form. Advantageously, the dielectric material has a dielectric constant which is at least equal to the dielectric constant of air. Preferably, the dielectric material has a dielectric constant which is higher than the dielectric constant of air. Consequently, liquids or solid dielectric materials are generally preferred. The dielectric material is preferably selected from the group consisting of a plastic material, preferably a fluoropolymer, a silicon dioxide containing material, preferably a quartz glass, a ceramic material, and a gaseous material, and combinations thereof. As matter of course, cheaper dielectric materials such as borosilicate glass, a polyolefin such as polyethylene, a polycarbonate, a polysulfone or polyvinyl chloride may also be used as a filler material.

The propagation speed of the microwave radiation is inversely proportional to the square root of the dielectric constant of the dielectric material arranged in the transmission duct. Consequently, at a constant frequency, the wavelength of the microwave radiation within the dielectric material is reduced, leading to a more dense succession of wave peaks at the interface provided in the transmission duct, thus ensuring an effective transmission of microwave radiation from the transmission duct to the sample to be heated.

Depending on the nature of the source of microwave radiation employed, the dielectric material can be arranged such that reflection losses upon coupling of the microwave radiation into the dielectric material are minimised. Accordingly, the dielectric material can have a front surface for receiving the microwave radiation at an incline with respect to the direction of propagation of the microwave radiation, thus resulting in a suitable impedance matching. Alternatively or additionally, impedance matching can be achieved by employing a front surface which is made from layers made from different materials which have, from the top surface to the final layer facing the bulk dielectric material, increasing dielectric constants.

The interface may also comprise means for controlling the temperature of the sample. Especially if the sample is arranged in a cavity surrounded by the interface and the dielectric material is arranged in the transmission duct, heat transfer from the sample to the environment is quite reduced due to the low thermal conductivity of the dielectric materials employed. However, after termination of the microwave application, it is often desired to quickly reduce the temperature of the sample, e.g. in order to stop chemical reactions in a controllable fashion or to allow fast further processing of the sample. In addition, it is usually preferred to avoid excessive heating of the applicator itself during microwave application. Thus, cooling ducts may be arranged in the interface where a cooling medium having low microwave absorbance is circulated. Further, even when a material having a low absorbance for microwave radiation is used to construct the interface, such a material will often have a high thermal capacity and/or a low thermal conductivity which might lead to a considerable increase of the temperature of the interface. Thus, cooling ducts arranged in the interface not only help to control the temperature of the sample but also help to quickly reduce the temperature of the interface after termination of the microwave treatment.

The cavity of the microwave applicator preferably has an essentially cylindrical shape with a longitudinal axis defined by the centre axis of the cylinder. The tapering portion of the transmission duct is adapted to form a jacket surrounding the cavity with the interface forming an inner wall of the jacket. The jacket has a longitudinal axis which is preferably arranged parallel to the longitudinal axis of the cavity. Accordingly, the cavity of microwave applicator according to the invention exhibits superior resistance to pressure allowing a heating of the sample under increased pressure.

Based on the direction of propagation of the microwave radiation within the tapering portion of the transmission duct, there are two preferred orientations of the transmission duct with respect to the cavity.

According to a first embodiment, the direction of propagation of microwave radiation within the tapering portion of the transmission duct is essentially parallel to the longitudinal axis of the cavity.

According to a second embodiment, the microwave applicator is arranged such that the direction of propagation of the microwave radiation within the tapering portion of the transmission duct is essentially perpendicular to the longitudinal axis of the cavity.

Different embodiments for providing the microwave radiation can be envisioned. According to one variant of the microwave applicator of the present invention, the applicator itself is not provided with a microwave generator. Thus, the source of microwave radiation comprises a waveguide which couples the transmission duct of the applicator to an external microwave generator, for instance a magnetron. According to another embodiment, the source of microwave radiation comprises means for generating microwave radiation, for instance a magnetron directly coupled to the applicator. In this embodiment, the microwave-generating means may comprise a microwave generator and an emitter antenna where the emitter antenna is arranged directly in the transmission duct.

The present invention also concerns a microwave-heating apparatus which comprises at least one microwave applicator as defined above and means for arranging a sample in the cavity of the at least one microwave applicator, wherein the means for arranging the sample in the cavity are at least partially made from a microwave-transparent material. The means for arranging a sample in the microwave cavity can be in the form any suitable vessel, container or duct, depending on whether batch or continuous operation is desired. The means for arranging a sample in the cavity are preferably pressurizable.

Specifically, the microwave-heating apparatus of the present invention may comprise more than one applicator arranged at different portions of the container, conduit or vessel containing the sample to be heated. In the embodiment where the tapering portion of the transmission duct is parallel to the longitudinal axis of the cavity, two or more applicators may be arranged successively in the direction of the longitudinal axis. In this event, suitable means such as a perforated plate may be provided in the conduit housing of the sample to be treated to avoid cross-talk of microwave radiation from one applicator to another. In the embodiment where the microwave applicator is arranged such that the tapering portion is essentially perpendicular to the longitudinal axis of the cavity, two or more applicators can be stacked on top of each other in the direction of the longitudinal axis. In this event, no cross-talk between the transmission ducts of the stacked applicators will occur.

The invention will now be described in more detail making reference to preferred embodiments depicted in the attached drawings.

BRIEF DESCRIPTION OF THE DRAWINGS

FIG. 1 is a schematic cross-sectional view of a rather simple embodiment of the microwave applicator of the invention;

FIG. 2 is a schematic cross-section of a first embodiment of an applicator of the invention having a cavity where the tapering section of the applicator is arranged parallel to the longitudinal axis of the cavity;

FIG. 3 depicts a variant of the applicator of FIG. 2 where the source of microwave radiation comprises a waveguide;

FIG. 4 depicts a further variant of the embodiment of FIG. 2 where the source of microwave radiation comprises a microwave generator;

FIG. 5 depicts a second embodiment of the microwave applicator of the invention where the tapering section of the transmission duct is arranged perpendicularly to the longitudinal axis of the cavity;

FIG. 6 depicts a variant of the embodiment of FIG. 5 where the source of microwave radiation comprises a waveguide;

FIG. 7 depicts a further variant of the embodiment of FIG. 5 where the source of microwave radiation comprises a microwave generator;

FIG. 8 depicts a microwave-heating apparatus of the invention for continuous operation comprising two applicators of FIG. 6 stacked upon each other;

FIG. 9 depicts a microwave-heating apparatus of the invention for batch operation comprising two applicators of FIG. 6 stacked upon each other;

FIG. 11b is an enlarged view of a portion of FIG. 11a;

FIG. 12 depicts a further embodiment of the microwave-heating apparatus of the invention similar to the embodiment of FIG. 9 having two microwave applicators stacked upon each other;

FIG. 13 represents a partly perspective, partly cross-sectional view of the two applicators of the apparatus of FIG. 12;

FIG. 14 represents a partly perspective, partly cross-sectional view of the second applicator of the apparatus of FIG. 12;

FIG. 15a depicts a further cross-sectional view of the apparatus of FIG. 12; and FIG. 15b is an enlarged view of a portion of FIG. 15a.

DETAILED DESCRIPTION OF THE INVENTION

Figure 10:
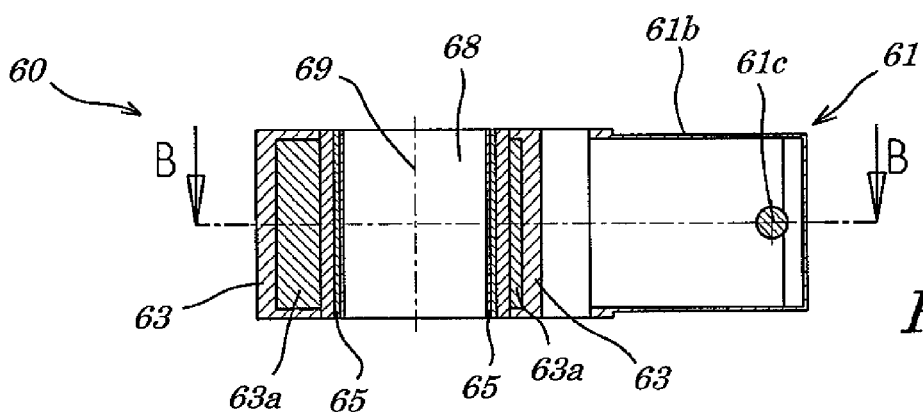
FIG. 10 is a more detailed cross-sectional view of the variant of the applicator depicted in FIG. 6.

In FIG. 1 a first embodiment of the microwave applicator 10 according to the invention is shown. The applicator 10 consists of a waveguide 11 coupling microwave radiation (depicted as undulating arrows 12) which is transferred from a source of microwave radiation (not shown in FIG. 1) to a tapering portion 13 of the applicator 10. Waveguide 11 and tapering portion 13 of the applicator are made from conductive metal sheets and define the external walls of a hollow tube 14 in which the microwave radiation 12 propagates. In a portion of the wall defining the tapering portion of the transmission duct 13, an interface 15 (depicted in dashed lines) is provided. The interface 15 made from a material which is partially permeable to microwave radiation. Beneath the interface 15, a sample 16 to be heated by microwave radiation is arranged. Although the general direction of propagation of the microwave radiation inside the applicator 10 is essentially parallel to the interface 15 as depicted by arrow 17, a part of the microwave radiation will be transmitted perpendicularly to the overall direction of propagation 17 through the interface 15 into the sample 16. Upon absorption of the transmitted microwave radiation, sample 16 is heated. In the embodiment of FIG. 1, the interface 15 is essentially a rectangular planar surface which can be placed directly on the sample to be heated. Due to the tapering of the transmission duct 13, the energy density transmitted into the sample per unit area of the interface 15 will be essentially constant along the direction of propagation 17.

FIG. 2 shows a further embodiment of the microwave applicator 20 of the invention. Elements of the embodiment of FIG. 2 which correspond to elements of the embodiment of FIG. 1 or which have a similar function are denoted by the same reference numerals but increased by 10 and will not be described in detail again. Accordingly, reference numeral 24 denotes a hollow tube. The applicator 20 comprises a cavity 28 in which the sample 26 to be heated is arranged. The cavity 28 is essentially defined by the partially microwave-permeable interface 25 of the tapering section 23 of the applicator 20. Cavity 28 has an overall cylindrical form having a longitudinal axis 29. The interface 25 is essentially arranged parallel to the longitudinal axis 29 of the sample surrounding the longitudinal axis 29 in order to define a cylindrical jacket surrounding the cavity. On the right side of FIG. 2, the geometrical arrangement of the tapering section 23 circumferentially surrounding the longitudinal central axis 29 of cavity 28 is depicted schematically. Consequently, microwave radiation 22 can penetrate from all sides through jacket-like interface 25 into sample 26.

In FIG. 3, a first variant of the embodiment of FIG. 2 is shown. Elements of the embodiment of FIG. 3 which correspond to elements of the embodiment of FIG. 2 or which have a similar function are denoted by the same reference numerals but increased by 10 and will not be described in detail again. Accordingly the hollow tube is denoted by reference numeral 34, the interface by 35, the sample by 36, the cavity by 38 and the central axis by 39. In this embodiment, the microwave applicator 30 comprises a source of microwave energy which is constituted by a waveguide 31 for transferring microwave radiation 32 from an external source (not shown in FIG. 3) to the tapering section 33.

In FIG. 4, a further variant of the microwave applicator of FIG. 2 is shown. Elements of the embodiment of FIG. 4 which correspond to elements of the embodiment of FIG. 2 or which have a similar function are denoted by the same reference numerals but increased by 20 and will not be described in detail again. Thus, the hollow tube is denoted by reference numeral 44. The applicator 40 of FIG. 4 has a source of microwave radiation which comprises an antenna 41 arranged within the tapering section 43 of the applicator 40. Antenna 41 is coupled to a microwave generator (not shown in FIG. 4), such as a magnetron arranged outside of the tapering section 43. Microwaves 42 emitted by antenna 41 propagate within the tapering section 43 and are absorbed by sample 46 via the at least partially microwave-permeable interface 45, which again forms a cylindrical jacket surrounding cavity 48.

FIGS. 5 to 7 show an alternative arrangement of the tapering section of the microwave applicator of the invention as compared to the embodiments of FIGS. 2 to 4. Elements of the embodiment of FIGS. 5 to 7 which correspond to elements of the embodiment of FIG. 2 or which have a similar function are denoted by the same reference numerals but increased by 30, 40 and 50, respectively, and will not be described in detail again. Thus, the hollow tube is denoted by reference numeral 54. FIG. 5 shows a cross-sectional view perpendicular to the longitudinal axis 59 of a cavity 58, which houses the sample 56 to be treated by microwave radiation. As can be seen, the tapering portion 53 of applicator 50 is arranged such that the direction of propagation of the microwave radiation 52 is essentially perpendicular to the longitudinal axis of a cavity 58. The geometrical arrangement of the envelope of tapering section 53 is more clearly depicted in the schematic drawing on the right side of FIG. 5. Essentially, the tapering portion 53 is wrapped around the cavity 58 transversely with respect to the longitudinal axis 59 forming a jacket having a circumferentially decreasing taper. The inner surface of the jacket adjacent to the cavity 58 defines the interface 55 which allows microwave radiation to enter the cavity. Similar to the embodiments of FIGS. 3 and 4, the embodiments of FIGS. 6 and 7 show variants of the embodiment of FIG. 5 where the source of microwave radiation is either waveguide 61 provided with the apparatus 60 of FIG. 6 or an antenna 71 of a microwave generator arranged within the tapering section 73 of the microwave apparatus 70 of the embodiment of FIG. 7. In FIG. 6, reference numeral 64 denotes a hollow tube. Further, in FIG. 7, microwave radiation is denoted by reference numeral 72, the hollow tube by 74, the interface by 75, the sample by 76, the cavity by 78 and the longitudinal axis by 79.

FIG. 8 schematically depicts a cross-sectional view parallel to the longitudinal axis of a cylindrical cavity of a microwave-heating apparatus which comprises two microwave applicators 60, 60', each essentially corresponding to the microwave applicator 60 of FIG. 6. The applicators 60, 60' are stacked upon each other in the longitudinal direction of the central longitudinal axis 69 of cavity 68 in order to provide a larger overall interface 65 for transmitting microwave radiation 62, 62' into the sample 66. In the embodiment of FIG. 8, the cavity 68 is arranged as a conduit capable of transporting sample 66 in a continuous manner through the microwave treatment area defined by the jacket-like interfaces 65 respectively. Reference numeral 61' denotes the wave wide of the second microwave applicator 60'.

FIG. 9 essentially corresponds to the embodiment of FIG. 8 except that the cavity 68' defined by a vessel-like interface 65' is conceived as a cylindrical recess adapted to accommodate a suitable vessel for batch treatment of sample 66'. As schematically shown in FIG. 9, a lid 68a may be provided to protect sample 66' from contamination or to ensure that pressurised heating is possible. Conduits 66a, 66b are schematically shown as examples of means to access the internal cavity 68'. Reference numeral 61b' denotes the wave guide of the second microwave applicator. Such means may comprise conduits to supply and discharge samples or reactants. Alternatively, means for stirring the content of the vessel and/or for measuring properties of the internal cavity such as temperature or pressure may be provided. The antenna of the second microwave applicator is denoted by reference numeral 61c' and the dielectric material of the second microwave applicator is denoted by reference numeral 63a'.

Figure 11A:
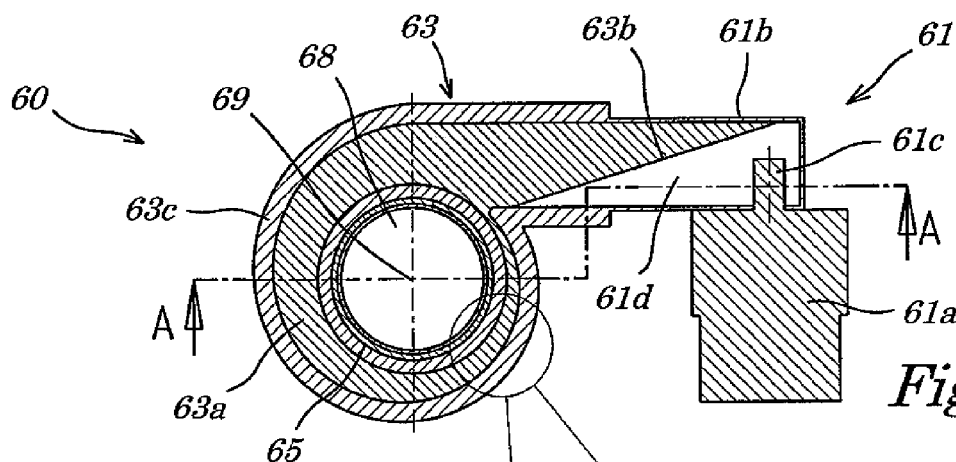
FIG. 11a is a further cross-sectional view of the embodiment of FIG. 6.
Figure 11B:
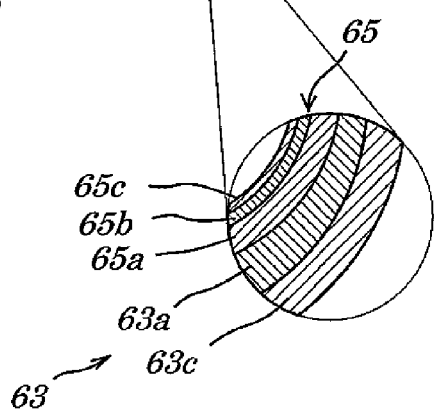

FIGS. 10 to 11b show a variant of the microwave applicator of FIG. 6 in more detail according to a cross-sectional view parallel to the longitudinal axis 69 of cavity 68 (FIG. 10) and perpendicular to the longitudinal axis 69 of cavity 68 (FIG. 11a). Elements of the embodiment of FIGS. 10 to 11b which correspond to elements of the embodiment of FIG. 6 or which have a similar function are denoted by the same reference numerals and will not be described in detail again. As can be taken form FIGS. 10 and 11a, the source of microwave energy 61 comprises a magnetron 61a, arranged outside of waveguide 61b. An antenna 61c coupled to magnetron 61a is inserted into waveguide 61b in order to generate microwave radiation which is transmitted towards the tapering transmission duct 63 of applicator 60. In the present embodiment, the transmission duct 63 is filled with a solid dielectric material 63a, e.g. PTFE. As the internal space 61d of waveguide 61b is filled with air, the front face 63b of the dielectric material 63a facing the antenna 61c is inclined with respect to the direction of propagation of microwave radiation as defined by the longitudinal axis of waveguide 61b in order to minimize reflection of microwave radiation upon entering the dielectric material 63a. This configuration ensures a smooth increase of the dielectric constant along the direction of propagation of microwave radiation from a dielectric constant of air to the dielectric constant of the material filling the tapering transmission duct 63.

FIG. 11b shows a portion of the tapering section of transmission duct 63 in more detail. As can be taken from FIG. 11b, transmission duct 63 is externally delimited by a metallic wall 63c and internally delimited by a partially microwave-transparent interface 65 which consists of several layers 65a, 65b and 65c. The internal volume defined by external wall 63c and interface 65 is filled with the dielectric material 63a through which microwave radiation generated by microwave source 61 can propagate. As shown in the embodiment of FIGS. 10-11b, the interface 65 can be constituted by several functional layers which can be designed in accordance with any particular requirements of a particular application. For instance, layer 65a can be made of a ceramic material which ensures enough structural strength of the interface 65 in order to withstand high pressures within a cavity 68. Layer 65b can be provided with means to control the temperature of the sample housed in cavity 68 and layer 65c can, for instance, be a thin, chemically inert liner, e.g. made from PTFE.

FIGS. 12 to 15b depict various views of a further variant of the embodiment of FIG. 9. Elements of the embodiment of FIGS. 12 to 15b which correspond to elements of the embodiment of FIG. 9 or which have a similar function are denoted by the same reference numerals and will not be described in detail again. FIG. 12 depicts an embodiment of the microwave-heating apparatus of the invention in which two microwave applicators such as the applicator of FIG. 11a are stacked upon each other along the central vertical axis of an essentially cylindrical cavity containing the sample 66 to be treated. As can be taken from FIGS. 13 and 14, the heating apparatus of FIG. 12 comprises two microwave applicators similar to the applicator described in connection with FIG. 11a. Accordingly, two magnetrons 61a, 61a' are provided to feed microwave radiation into the tapering transmission ducts 63, 63', respectively. From the partly cross-sectional partly perspective views of FIGS. 15a, 15b taken along the longitudinal axis of cavity 68, the means for controlling the temperature of sample 66 can be seen in more detail. Accordingly, cooling channels 65d are arranged in the functional layer 65b of interface 65. A cooling liquid having low microwave absorbance is fed to the apparatus via entry manifold 65e and circulated through the cooling channels 65d to leave the apparatus via exit manifold 65f. Entry manifold 65e, cooling channels 65d and exit channels 65f can be part of a closed cooling circuit (not shown in the drawings) which may, for instance, comprise a heat exchanger (also not shown).

Having described the invention, the following is claimed:
1. A microwave applicator for heating a sample by microwave radiation comprising:
   a source of microwave radiation,
   a cavity for receiving said sample to be heated, said cavity having a longitudinal axis,
   a transmission duct for transmitting said microwave radiation from said source to said sample, said transmission duct having a tapering portion that comprises:
      at least one external wall defining an internal cross-section area perpendicular to a direction of propagation of the microwave radiation, wherein said internal cross-section area decreases in the direction of propagation of the microwave radiation, and at least one inner wall having an elongated interface that extends in the direction of propagation of the microwave radiation and coincides with said at least one external wall, said elongated interface at least partially permeable to the microwave radiation, wherein said at least one inner wall defines the cavity for receiving said sample, wherein said at least one external wall surrounds said at least one inner wall to form a jacket surrounding said cavity, said at least one external wall and said at least one inner wall defining an internal space therebetween for propagation of the microwave radiation, wherein said internal cross-section area has an essentially constant width parallel to said elongated interface and a height perpendicular to said elongated interface, said height decreasing along said direction of propagation of said microwave radiation, wherein said at least one external wall has a width that is essentially the same as (i) the width of the internal cross-section area and (ii) width of the at least one inner wall, and wherein said at least one external wall converges toward the at least one inner wall in the direction of propagation of the microwave radiation.

2. The microwave applicator according to claim 1, wherein said transmission duct houses dielectric material.

3. The microwave applicator according to claim 2, wherein said dielectric material has a dielectric constant equal to or higher than the dielectric constant of air.

4. The microwave applicator according to claim 3, wherein said dielectric material is selected from the group consisting of:
a plastic material, preferably a polyolefin, a polycarbonate, a polysulfone or a fluoropolymer, a silicon dioxide containing material, preferably a borosilicate glass or quartz glass, a ceramic material, and gaseous materials and combinations thereof.

5. The microwave applicator according to claim 2, wherein said dielectric material has a front surface for receiving said microwave radiation, said front surface being inclined with respect to the direction of propagation of said microwave radiation.

6. The microwave applicator according to claim 1, wherein said elongated interface comprises means for controlling the temperature of said sample.

7. The microwave applicator according to claim 1, wherein said cavity has an essentially cylindrical shape.

8. The microwave applicator according to claim 1, wherein the direction of propagation of said microwave radiation within said tapering portion of said transmission duct is essentially parallel to said longitudinal axis of said cavity.

9. The microwave applicator according to claim 1, wherein the direction of propagation of said microwave radiation within said tapering portion of said transmission duct is essentially perpendicular to said longitudinal axis of said cavity.

10. The microwave applicator according to claim 1, wherein said source of microwave radiation comprises a waveguide for coupling said transmission duct to an external means for generating microwave radiation.

11. The microwave applicator according to claim 1, wherein said source of microwave radiation comprises means for generating microwave radiation.

12. The microwave applicator according to claim 11, wherein said means for generating microwave radiation comprises a microwave generator and an emitter antenna arranged in said transmission duct.

13. A microwave-heating apparatus comprising:
at least one microwave applicator including:
a source of microwave radiation,
a cavity for receiving said sample to be heated, said cavity having a longitudinal axis,
a transmission duct for transmitting said microwave radiation from said source to said sample, said transmission duct having a tapering portion that comprises:
at least one external wall defining an internal cross-section area perpendicular to a direction of propagation of the microwave radiation, said internal cross-section area decreases in the direction of propagation of the microwave radiation, and
at least one inner wall having an elongated interface that extends in the direction of propagation of the microwave radiation and coincides with said at least one external wall, said elongated interface at least partially permeable to the microwave radiation, wherein said at least one inner wall defines the cavity for receiving said sample, wherein said at least one external wall surrounds said at least one inner wall to form a jacket surrounding said cavity, said at least one external wall and said at least one inner wall defining an internal space therebetween for propagation of the microwave radiation, wherein said internal cross-section area has an essentially constant width parallel to said elongated interface and a height perpendicular to said elongated interface, said height decreasing along said direction of propagation of said microwave radiation, wherein said at least one external wall has a width that is essentially the same as (i) the width of the internal cross-section area and (ii) width of the at least one inner wall, and wherein said at least one external wall converges toward the at least one inner wall in the direction of propagation of the microwave radiation; and means for arranging said sample in said cavity of said at least one microwave applicator, said means for arranging said sample in said cavity being at least partially made from a microwave-transparent material.

14. The microwave-heating apparatus of claim 13, wherein said means for arranging said sample in said cavity is pressurizable.

15. The microwave-heating apparatus of claim 13, wherein said means for arranging said sample in said cavity comprises a sample vessel.

16. The microwave-heating apparatus of claim 13, wherein said means for arranging said sample in said cavity comprises a conduit for a fluid sample.

* * * * *